United States Patent
Dittus et al.

(10) Patent No.: US 8,727,138 B2
(45) Date of Patent: May 20, 2014

(54) TOOLLESS RAIL ENABLING SIMPLIFIED INSTALLATION AND REMOVAL

(75) Inventors: Karl K. Dittus, Durham, NC (US); Aubrey L. Hodges, Creedmoor, NC (US); Daniel P. Kelaher, Holly Springs, NC (US); Brian A. Trumbo, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 368 days.

(21) Appl. No.: 13/289,476

(22) Filed: Nov. 4, 2011

(65) Prior Publication Data

US 2013/0112638 A1    May 9, 2013

(51) Int. Cl.
*A47F 7/00* (2006.01)
*A47B 88/00* (2006.01)

(52) U.S. Cl.
USPC .......................................... 211/26; 312/334.4

(58) Field of Classification Search
CPC ............ A47B 88/044; A47B 88/0418; A47B 88/0422; A47B 96/06; H05K 7/1421; H05K 7/1489; H05K 7/183
USPC ........... 211/26, 192; 312/223.1, 265.1–265.4, 312/319.1, 334.1, 334.4, 334.5; 248/298.1, 248/201, 220.21, 220.31, 220.41
See application file for complete search history.

(56) References Cited

U.S. PATENT DOCUMENTS

| | | | |
|---|---|---|---|
| 6,469,899 B2 | 10/2002 | Hastings et al. | |
| 6,523,918 B1 | 2/2003 | Baiza | |
| 6,666,340 B2 | 12/2003 | Basinger et al. | |
| 6,749,275 B2 * | 6/2004 | Cutler et al. | 312/334.4 |
| 6,840,388 B2 | 1/2005 | Mayer | |
| 6,871,920 B2 * | 3/2005 | Greenwald et al. | 312/334.4 |
| 6,891,727 B2 | 5/2005 | Dittus et al. | |
| 6,926,378 B2 * | 8/2005 | Greenwald et al. | 312/334.4 |
| 6,929,339 B1 * | 8/2005 | Greenwald et al. | 312/334.4 |
| 6,935,711 B1 * | 8/2005 | Naue et al. | 312/334.4 |
| 6,957,878 B2 * | 10/2005 | Greenwald et al. | 312/334.4 |
| 7,192,103 B2 * | 3/2007 | Hamilton | 312/334.5 |
| 7,318,532 B1 | 1/2008 | Lee et al. | |
| 7,641,297 B2 * | 1/2010 | Huang | 312/334.4 |
| 7,699,279 B2 * | 4/2010 | Chen et al. | 248/220.41 |
| 7,731,142 B2 * | 6/2010 | Chen et al. | 248/244 |
| 7,798,581 B2 | 9/2010 | Chen et al. | |
| 7,857,145 B2 * | 12/2010 | Mushan et al. | 211/26 |
| 7,878,468 B2 | 2/2011 | Chen et al. | |
| 7,930,812 B2 | 4/2011 | Curnalia et al. | |

(Continued)

*Primary Examiner* — Jonathan Liu
*Assistant Examiner* — Patrick Hawn
(74) *Attorney, Agent, or Firm* — Katherine S. Brown; Jeffrey L. Streets (57) ABSTRACT

A rail for toolless installation between first and second vertical rack rails. The rail comprises a telescoping rail body having a first and second ends, and an inside surface having a shelf, wherein a latch assembly is disposed at each end of the rail body. Each latch assembly comprises a flange secured to an end of the rail, a latch arm, a release handle, and a retractable pin. The latch arm is pivotally secured to the rail body, distally extends from the flange, and is biased toward a latched position. The release handle is on the inside surface of the rail body for movement from a latched position to an unlatched position. The retractable pin distally extends from each end and is biased toward a distally extended position, wherein the pin is stepped from a first diameter portion to a second larger diameter portion for adapting to different sized holes.

19 Claims, 11 Drawing Sheets

(56) References Cited

U.S. PATENT DOCUMENTS

| | | | |
|---|---|---|---|
| 7,934,607 B2 | 5/2011 | Henderson et al. | |
| 8,104,626 B2* | 1/2012 | Huang et al. | 211/26 |
| 8,353,494 B2* | 1/2013 | Peng et al. | 248/298.1 |
| 8,371,454 B2* | 2/2013 | Chen et al. | 211/26 |
| 2003/0234602 A1* | 12/2003 | Cutler et al. | 312/333 |
| 2004/0104184 A1* | 6/2004 | Hartman et al. | 211/26 |
| 2005/0206285 A1* | 9/2005 | Greenwald et al. | 312/334.5 |
| 2007/0025812 A1* | 2/2007 | Tsai | 403/353 |
| 2008/0078899 A1* | 4/2008 | Chen et al. | 248/220.21 |
| 2008/0217274 A1* | 9/2008 | Curnalia et al. | 211/183 |
| 2008/0296455 A1 | 12/2008 | Brock et al. | |
| 2009/0250236 A1 | 10/2009 | Corwin et al. | |
| 2009/0261051 A1 | 10/2009 | Dittus et al. | |
| 2010/0200523 A1* | 8/2010 | Henderson | 211/26 |
| 2010/0243586 A1 | 9/2010 | Henderson et al. | |
| 2012/0018605 A1* | 1/2012 | Lacarra | 248/224.8 |
| 2012/0193489 A1* | 8/2012 | Yu et al. | 248/201 |
| 2012/0292274 A1* | 11/2012 | Lin et al. | 211/86.01 |
| 2013/0056432 A1* | 3/2013 | Lin et al. | 211/123 |

* cited by examiner

TOOLLESS RAIL ENABLING SIMPLIFIED INSTALLATION AND REMOVAL

BACKGROUND OF THE INVENTION

1. Field of the Invention

The present invention relates to rails for supporting equipment in a rack, and more specifically to rails that can be secured without the use of tools.

2. Background of the Related Art

Electronic devices, including data processing devices such as servers, are typically housed in standardized equipment enclosures. These enclosures have side walls that establish or include a rack. The rack is a substantially rectilinear metal frame having a plurality of mounting and alignment openings or holes that permit mounting various devices in the rack.

Rails are mounted to the walls or other support structure in the rack and form support for the electronic devices or components. The rails are screwed, bolted, or otherwise attached to the rack and the devices are placed on a pair or set of rails secured to opposing walls of the rack. In order to be attached to the rack, the length of the rails must be appropriately configured to cooperate with the rack.

Because a computer system may not completely fill a rack and because individual devices or chassis may have various heights, it is desirable to have rails that can be selectively mounted at desired heights within the rack. In this manner, the vertical spacing between rails can be incrementally adjusted to accommodate specific devices as the computer system is being installed or reconfigured. Typically, the height of a device is an integer multiple of a "unit" height (otherwise known as a "U"), wherein each unit of height measures 1.75 inches. Standardized rack specifications are provided by the Electronic Industries Alliance (EIA).

BRIEF SUMMARY OF THE INVENTION

One embodiment of the present invention provides a rail for toolless installation between first and second vertical rack rails. The rail comprises a telescoping rail body having a first end forming a first flange, a second end forming a second flange, and an inside surface having a shelf, wherein a latch assembly is disposed at each end of the rail body. Each latch assembly comprises a latch arm, a release handle, and a retractable pin. The latch arm is pivotally secured to the rail body, distally extends from the flange, and is biased toward a latched position. The release handle is accessible from the inside surface of the rail body, wherein manual movement of the release handle will move the latch arm from a latched position to an unlatched position. The retractable pin distally extends from each end and is biased toward a distally extended position, wherein the pin is stepped from a distal portion having a first diameter to a proximal portion having a second diameter greater than the first diameter.

DETAILED DESCRIPTION OF THE INVENTION

One embodiment of the present invention provides a rail for toolless installation between first and second vertical rack rails. The rail comprises a telescoping rail body having a first end, a second end, and an inside surface having a shelf, wherein a latch assembly is disposed at each end of the rail body. Each latch assembly comprises a flange secured at one end of the rail body, a latch arm, a release handle, and a retractable pin. The latch arm is pivotally secured to the rail body, distally extends from the flange, and is biased toward a latched position. The release handle is accessible from the inside surface of the rail body, wherein manual movement of the release handle will move the latch arm from a latched position to an unlatched position. The retractable pin distally extends from each end and is biased toward a distally extended position, wherein the pin is stepped from a distal portion having a first diameter to a proximal portion having a second diameter greater than the first diameter.

The telescoping rail body may be formed from two rail segments, where a first rail segment is slideably received within a channel formed by a second rail segment. The first and second segments should be of suitable lengths so that the rail body can be retracted to fit between first and second vertical rack side rail, and extended so that the first and second latch assemblies can latch to the first and second vertical rack side rails while having sufficient overlap to remain rigid. Preferably, the telescoping rail body is installed with the first end against the first vertical rack rail and the second end against the second vertical rack rail.

The telescoping rail body also has an inside surface that faces the component storage space of the rack and has a shelf extending inwardly from the inside surface. The shelf may be continuous or discontinuous along the length of the rail. A discontinuous shelf might be formed only on the outer rail segment or comprise short shelf elements adjacent on both rail segments near the ends of the rail body. Regardless of the configuration, the shelf should be able to support a component of information technology equipment within the rack. Non-limiting examples of such components include a server, a network switch, and a power supply. In order to accommodate various sizes of components, the height of the rail body may be 1 U, 2 U or any height suitable to securing a component in the rack.

As stated above, each latch assembly comprises a flange secured at one end of the rail body, a latch arm, a release handle, and a retractable pin. Each rail has two ends and a latch assembly at each end. The two flanges of a given rail face the two vertical rack rails along one side of the rack. In one embodiment, the inside surface of the rail body aligns with an inside edge of the vertical rack rails. The flange is preferably perpendicular to the rail and extends away from the inside surface of the rail. It is also preferable to secure the first and second ends of the rail body to opposing faces of the first and second vertical rack rails with no portion of the rail extending around the inside edge of the vertical rack rails.

The retractable pin provides alignment of the rail and latch arm relative to the vertical rack rail and its array of holes. However, the retractable pin also provides vertical support that prevents the rail from falling or sagging under the weight of an electronic component. The retractable pin distally extends from each flange and is biased toward a distally extended position, wherein the pin is stepped from a distal portion having a first diameter to a proximal portion having a second diameter greater than the first diameter. The two portions with different diameters allows the same rail to be installed in rack having vertical rack rails with different sizes of holes. The distal portion of the retractable pin will seat within vertical rack rail holes having a first dimension, and the proximal portion of the retractable pin will seat within vertical rack rail holes having a second dimension greater than the first dimension. As the rail segment and latch assembly are moved toward the vertical rack rail during installation, the distal portion of the pin enters the hole first. If the hole has a first dimension, then the step will hit the edges of the hole and prevent any further advance of the pin into the hole. However, if the hole has a second dimension, then the proximal portion can advance into the hole and be received therein. The distal and proximal portions of the retractable pin are preferably substantially cylindrical, such that they are easily received into a hole a suitable dimension and seat against the edges of the hole. The retractable pins, as well as the latch arms, are preferably compatible with EIA flanges having either round holes or square holes.

A benefit of the rectractable, stepped pin is that the rail flange engages the vertical rack rail regardless of whether the holes in the vertical rack receive the distal portion or the proximal portion of the retractable pin. Having the rail flange flush against the vertical rack rail increases the stability and strength of the installed rail. Specifically, leaving space between the mounting flange and rail reduces the clamp force of a screw and/or encourages bending of the rack or rail flanges when tightening the screw. This is very important in shipping configured systems and in earthquake prone areas.

Each latch assembly also includes a latch arm that is pivotally secured to the rail body, distally extends from the flange, and is biased toward a latched position. The pivot preferably has an axis that is perpendicular to the rail and allows the latch arm to move in a vertical plane when the rail is being installed. The latch arm is most preferably pivotally secured to an outside surface of the rail body, which both protects the latch assembly and allows the rail to present a smooth inside surface for receiving an electronic component.

The latch arm preferably has a distal surface that is slanted to cause the latch arm to retract against the bias upon engagement of the slanted surface with an edge of a hole in one of the vertical rack rails. Specifically, the latch arm is biased toward the latched position, but a stop element limits the latch arm's range of travel. With the latch biased against the stop element, the leading tip of the slanted surface is designed to align with a hole in the vertical rack rail. When the rail segment and associated latch assembly are manually pushed toward the vertical rack rail, then the slanted surface engages one side of the hole and is caused to pivot toward an unlatched position. Once the slanted surface has passed through the hole, the bias causes the latch arm to return to the latched position. The latch arm is prevented from backing out of the hole by a hook formed in the end of the latch arm. It should also be recognized that since the latch arm extends through the hole in the vertical rack rail, the latch assembly does not consume rack space by extending around the inside edge of the vertical rack rail. This enables the electronic component chassis to have maximum width.

A release handle is accessible from the inside surface of the rail body, wherein manual movement of the release handle will move the latch arm from a latched position to an unlatched position. When a user desires to detach a rail that has been latched to the vertical rack rail, the user will reach into the rack and manually move the release handle. In fact, the release handles associated with the two latch assemblies can both be actuated to release the rail with access to only one side of the rack. In a preferred configuration, the release handle is slidably secured to the rail body. Most preferably, manual movement of the release handle in a direction away from the adjacent rail flange will move the latch arm from the latched position to the unlatched position.

In another embodiment, the latch assembly includes a second retractable pin distally extending from each end and biased toward a distally extended position. The retractable pins preferably extend from the flange at points adjacent a top and adjacent a bottom of the flange with the latch arms extending from the flange between the retractable pins. Increasing the distance between the retractable pins increases the alignment and stability of the installed rail. Although the retractable pins may be independently biased, they are preferably formed as part of a common carriage that is itself biased so that the pins retract or extend together. The use of a common carriage may also maintain or improve the axial alignment and spacing of the pins, relative to independently biased pins. When the retractable pins are secured to a biased carriage, neither pin will enter into a vertical rack rail hole until both pins are fully aligned and neither pin will advance the larger diameter proximal portion unless both holes have sufficient dimensions.

In yet another embodiment, the latch assembly includes a second latch arm. Even with two latch arms in a latch assembly, it is preferable to have a single release handle. In one embodiment having two latch arms actuated with one release handle, the first latch arm has a first lever arm and the second latch arm has a second lever arm, such that the first and second lever arms extend toward each other and both engage the release handle. The first and second latch arms in this embodiment may be biased away from one another and may each have a hook facing away from the other latch arm. A potential benefit of having dual latch arms, is that the inadvertent release of one latch, such as by bumping the hook, prevents release of the entire latch assembly. When the dual latch arms having hooks directed in opposite directions, even bumping both latch arms in the same direction will not release the entire latch assembly.

It should be recognized that the rails or latch assemblies may include additional retractable pins or latch arms, or other elements altogether. For example, the rail flange will preferably include a threaded element spaced apart from the retractable pins at a fixed distance for alignment with a flange hole in order to threadably receive a threaded fastener. Although threaded fasteners are not necessary to the operation of the toolless rails disclosed, it may still be desirable to use threaded fasteners to additional stability such as during transportation of a rack to a data center where it will be put into use.

Embodiments of the latch assembly enable the rail to be latched to the vertical rack rails through horizontal movement of the rail flange toward the vertical rack rails. In other words, the rail is positioned between the vertical rack rails and telescopically extended in both directions to engage and latch with the vertical rack rails. Accordingly, the rail can be installed in height-constrained spaces of a rack without under-sizing the vertical dimension of the rail, since no vertical movement of the rail is necessary. Removal of the rail is similarly simple, in that the two release handles may be actuated from one side of the rack.

Although the invention has been described above in terms of a single rail, it should be recognized that most installations will also include a second longitudinally-extending rail for securing to an opposing vertical wall of the rack in a similar manner. Accordingly, first and second opposing rails may be installed at a common vertical height in the rack to form a shelf or other support for an electronic device.

Figure 1:
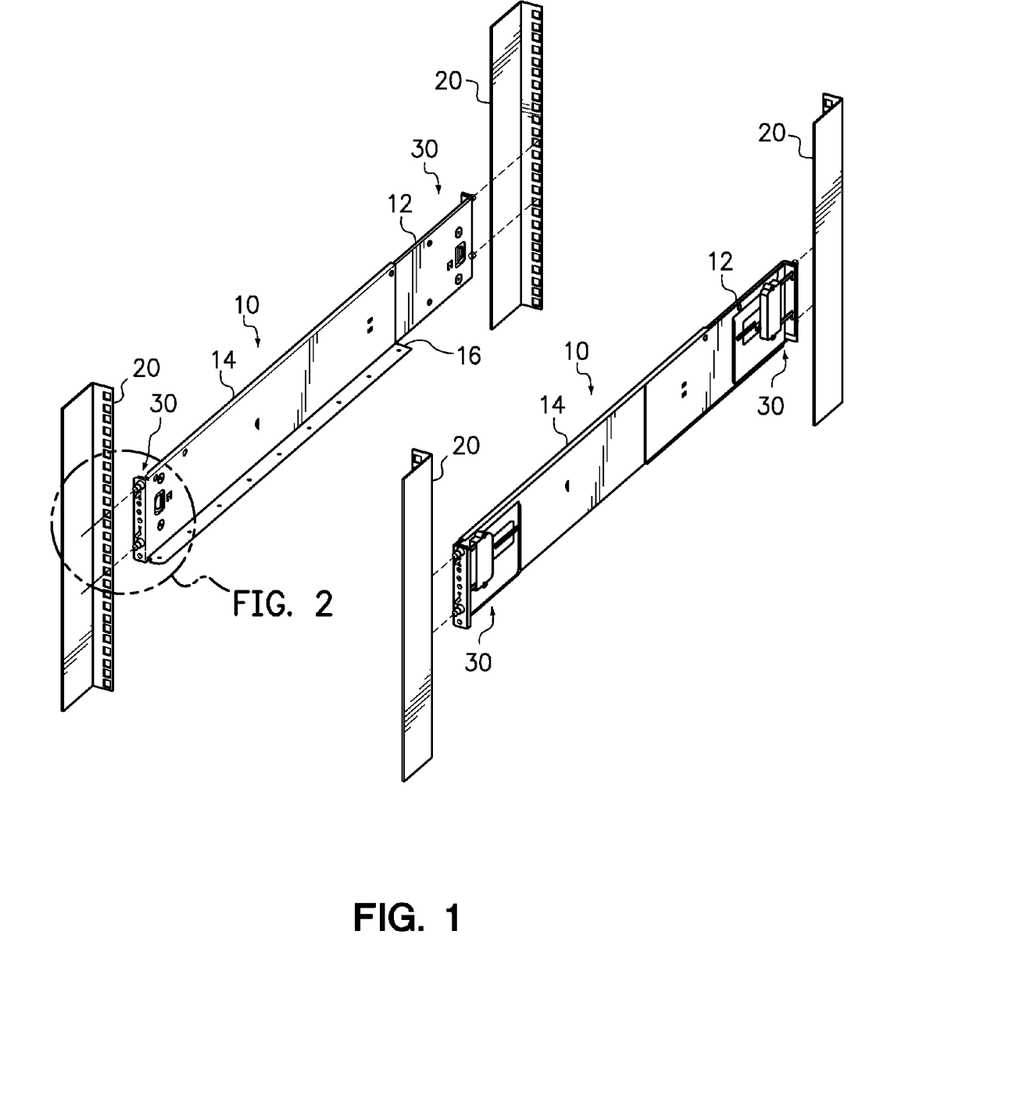
FIG. 1 is a perspective view of two toolless rails in position for installation between vertical rack rails.

FIG. 1 is a perspective view of two toolless rails 10 in position for installation between vertical rack rails 20. Both of the rails 10 are positioned between two vertical rack rails 20 on one side of a rack. Typically, the rails 10 will be installed at the same height with respect to the vertical rack rails 20 in order to support a rectangular chassis of an electronic component there between.

Each rail 10 includes a first rail segment 12 slideably received within a channel formed by a second rail segment 14. One or both of the rail segments 12, 14 may include a shelf 16. Collectively, the first and second rail segments may be referred to as a telescoping rail body. The opposing ends of the rail 10 each have a latch assembly 30 for securing the end of the rail to a vertical rack rail 20. As shown, the elements of the latch assemblies 30 are aligned with the holes 22 in the vertical rack rails 20 so that the toolless rails 10 can be secured by moving the first segments 12 toward the back and moving the second segments 14 toward the front. The components of one of the latch assemblies will be discussed in greater detail with respect to FIG. 2. The mechanics of each latch assembly 30 are preferably the same, but may be mirror images of the one disclosed in FIG. 2.

Figure 2:
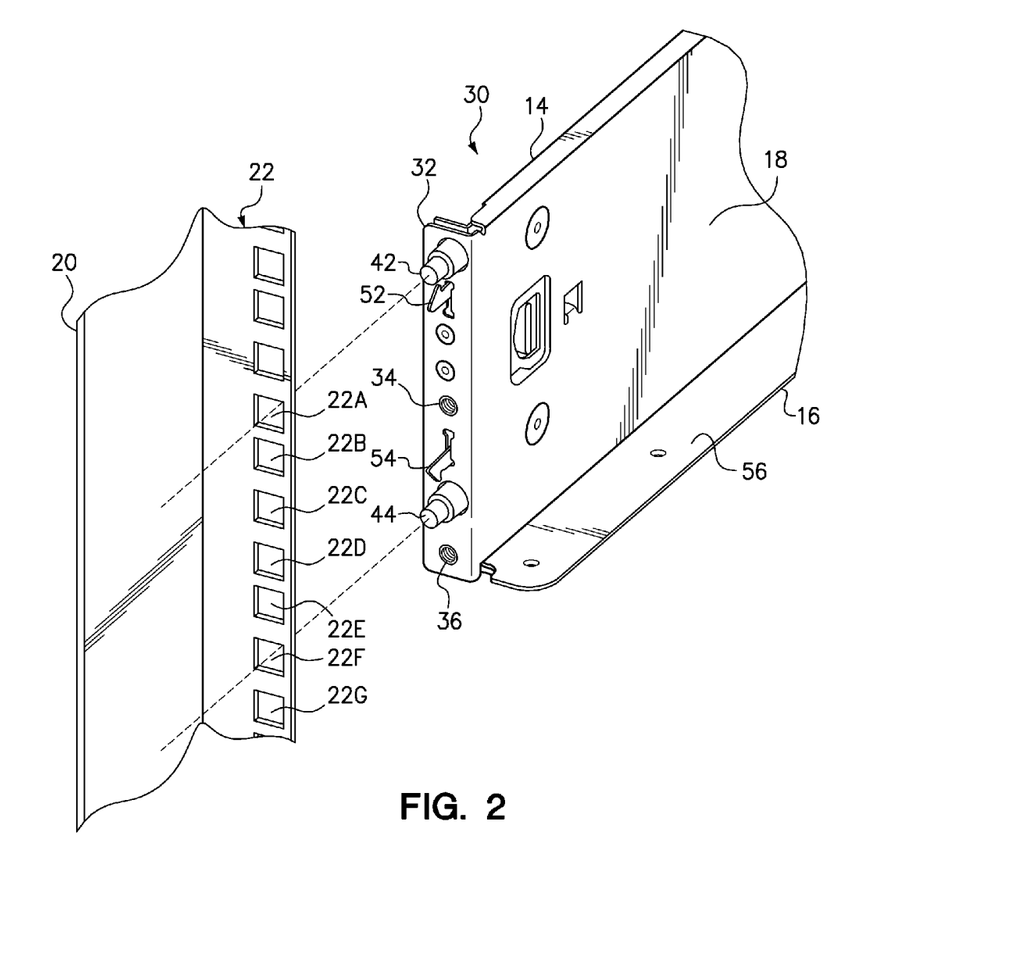
FIG. 2 is a perspective view of one end of a single toolless rail in position to be secured to a vertical rack rail.

FIG. 2 is a perspective view of a rail segment 14 of a toolless rail in position to be secured to a vertical rack rail 20. The rail segment 14 has a latch assembly 30 that is only partially shown in FIG. 2. However, a first retractable pin 42 is aligned with an upper vertical rack rail hole 22A and a second retractable pin 44 is aligned with a lower vertical rack rail hole 22F. The latch assembly 30 also includes a first latch arm 52 that is aligned with another vertical rack rail hole 22B and a second latch arm 54 that is aligned with yet another vertical rack rail hole 22E. It can also be seen that two internally threaded elements 34, 36 are aligned with two other holes 22D, 22G, respectively, for optionally receiving a threaded fastener. Each of the retractable pins 42, 44, latch arms 52, 54, and threaded elements 34, 36 are spaced apart on a flange 32 that is formed at the end of the rail segment 14. The flange 32 is preferably flat for engaging the flat side of the vertical rack rail 20. An inside surface 18 of the rail segment 14 is shown providing access to a release handle 56. The functioning of the latch assembly 30 will be discussed in greater detail below.

Figure 3:
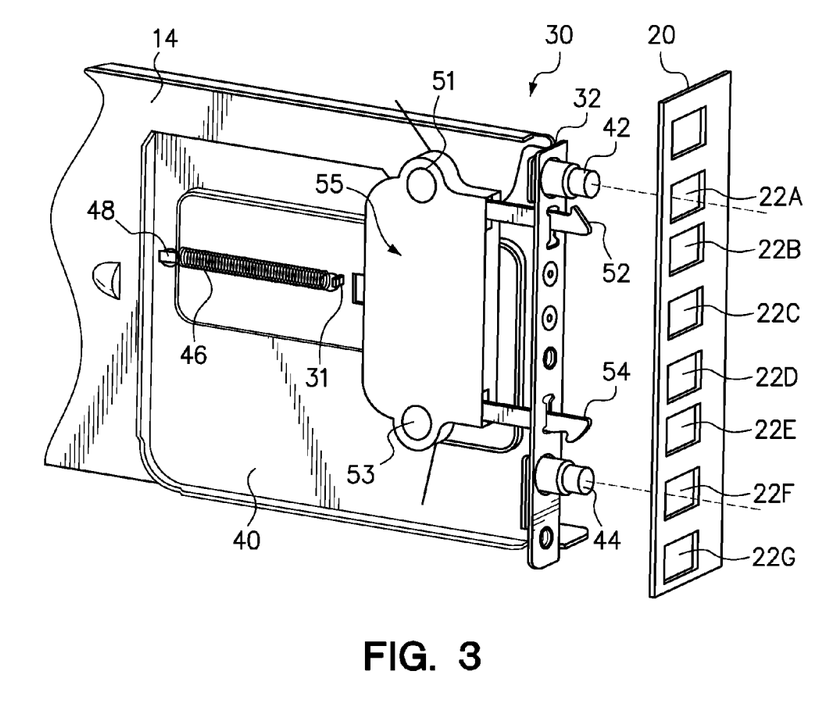
FIG. 3 is a perspective view of the same end of the toolless rail of FIG. 2 as seen from the opposing, outer side.

FIG. 3 is a perspective view of the same rail segment 14 of FIG. 2 as seen from the opposing, outer side. From this view, it is shown that the retractable pins 24, 44 are secured to a common carriage 40 that is slideably secured to the body of the rail segment 14. A spring 46 extends from a tab 48 on the carriage 40 to a tab 31 on the rail segment 14 in order to bias the carriage 40 toward the flange 32 and urge the pins 42, 44 to extend through corresponding holes in the flange 32.

The latch arms 52, 54 are pivotally secured to the rail segment 14 about pivot members 51, 53, respectively. A cover plate 55 is secured to the pivot members 51, 53 to prevent any interference with the release handle 56 and the actuation of the latch arms. The operation of the latch arms and the release handle is shown in greater detail with respect to FIGS. 4A and 4B.

Figure 4A:
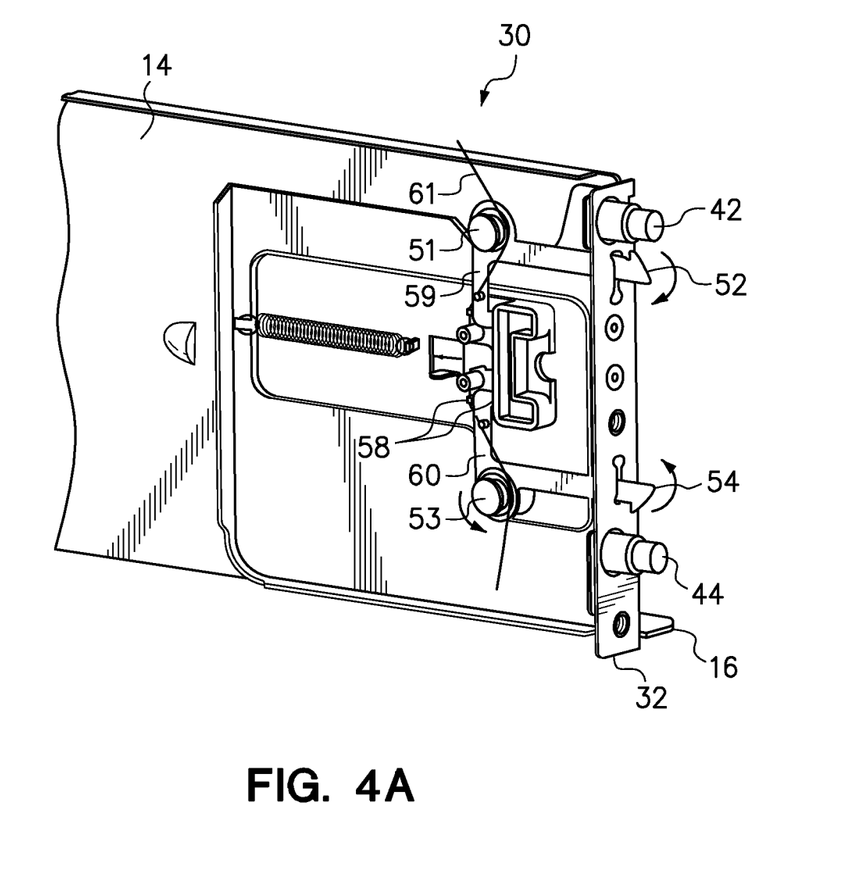
FIGS. 4A and 4B are perspective views of the end of the toolless rail as shown in FIG. 3, but with a latch cover removed to reveal movement of the latch components between a latched position and an unlatched position.
Figure 4B:
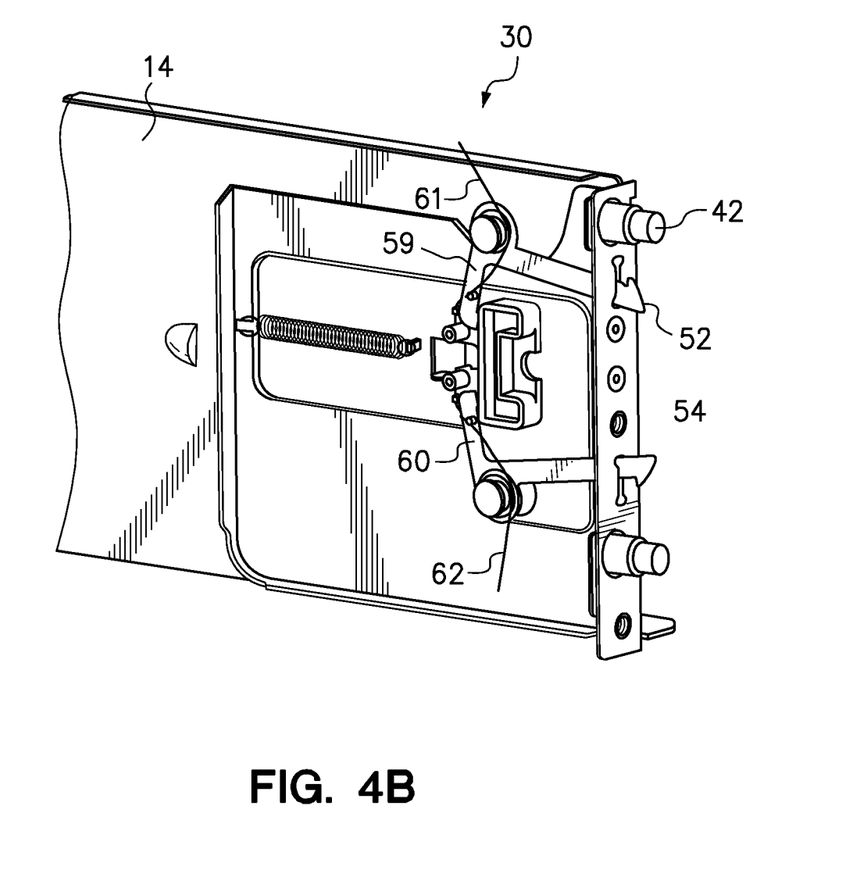

FIGS. 4A and 4B are perspective views of the rail segment 14 having a latch assembly 30 as shown in FIG. 3, but with the cover plate 55 removed to reveal movement of the latch arms 52, 54, and other components, between a latched position (See FIG. 4A) and an unlatched position (See FIG. 4B). It should be noted that the latch arms 52, 54 move independently of the retractable pins 42, 44.

With the cover plate removed, FIG. 4A shows a release element 57 that is integral with, or secured to, the release handle 56 (See FIG. 2). The release element 57 is slideably secured to the rail segment 14 to limit movement of the release element directly toward or away from the flange 32. The slideable release element 57 forms a track, channels or opposing protrusions 58 that receive the lever arms 59 there between. Accordingly, when the user manually moves the release handle in a direction away from the flange 32, the release element 57 slides with the release handle and causes the lever arms 59 to pivot about the pivot members 51, 53. Since the latch arms 52, 54 are coupled to the lever arms 59, 60, respectively, the latch arms 52, 54 are also caused to pivot. The arrows shown in FIG. 4A illustrate the movement that will occur when the release handle is actuated to unlatch the rail from the vertical rack rail.

FIG. 4B is a perspective view of the rail segment 14 as shown in FIG. 4A, after the release element 57 has been actuated to unlatch the latch arms 52, 54. Specifically, the release element 57 has moved away from the flange 32 (in a left direction in FIG. 4B), the upper lever arm 59 and latch arm 52 have pivoted (in a clockwise direction in FIG. 4B), and the lower lever arm 60 and latch arm 52 has pivoted (in a counter-clockwise direction in FIG. 4B). These movements occur as a result of a user manually actuating the release handle to unlatch the latch assembly 30. Furthermore, these or similar movements also occur when the rail is being attached to a vertical rack rail, and the slanted surface of the latch arm 52, 54 engage the edge of a hole in the vertical rack rail. For these movements to occur, forces on the release handle or the slanted surface must be sufficient to overcome the biasing force of springs 61, 62 that urge the latch arms 52, 54 toward the latched position (See FIG. 4A). Obviously, if the user releases the release handle or the slanted surface passed through the hole, then the springs 61, 62 cause the latch arms 52, 54 to automatically move toward the latched position.

Figure 5A:
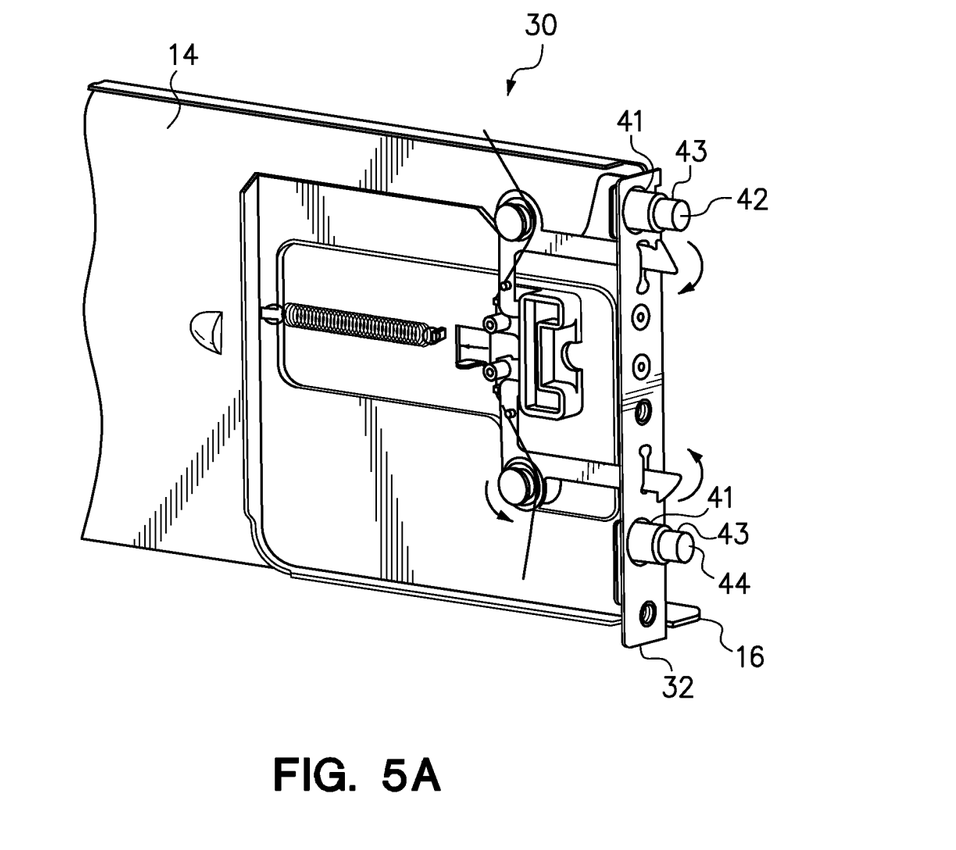
FIGS. 5A and 5B are perspective views of the end of the toolless rail as shown in FIG. 4A, to show the independent movement of a retractable pin assembly between a fully extended position and a retracted position.
Figure 5B:
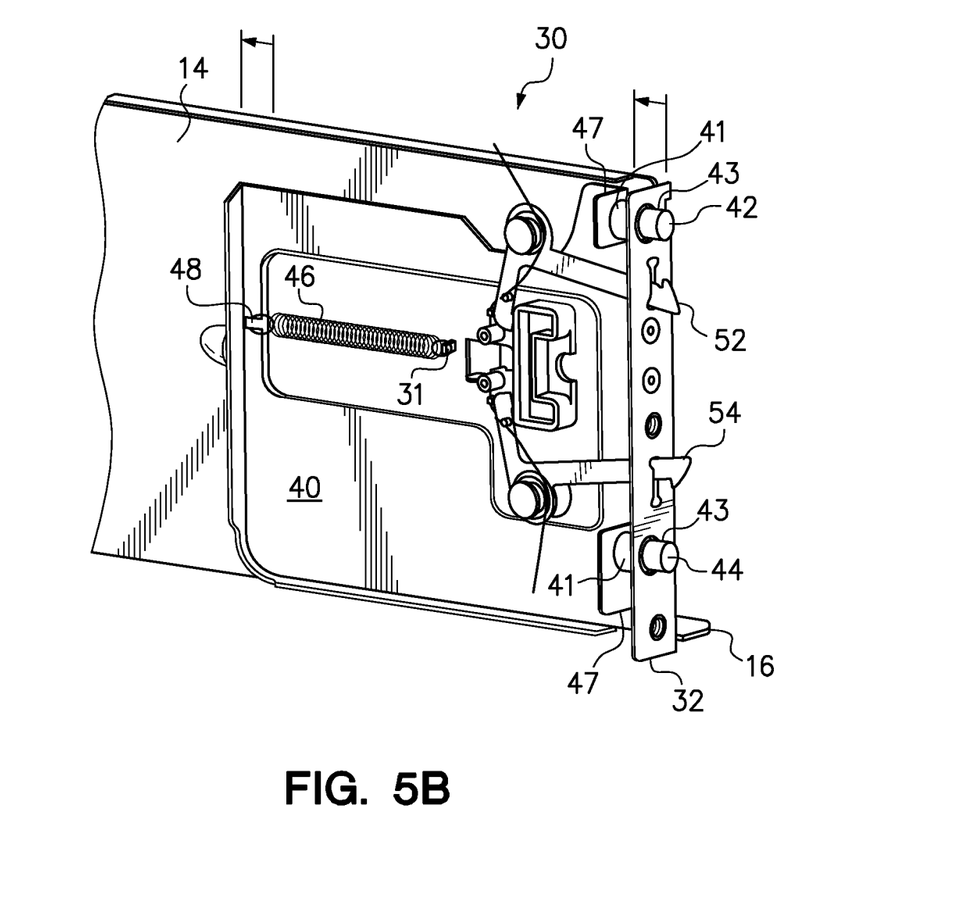

FIGS. 5A and 5B are perspective views of the rail segment 14 as shown in FIG. 4A, to show the independent movement of a retractable pin assembly between a fully extended position and a retracted position. FIG. 5A shows the retractable pins 42, 44 fully extended as would be the case prior to installing the rail and when the holes in the vertical rack rail are large enough to receive the larger diameter, proximal portion 41 of the pins. FIG. 5B shows the retractable pins 42, 44 retracted such that only the distal portion 43 of the pins extends beyond the flange 32 as would be the case when the holes in the vertical rack rail will only receive the small diameter, distal portion 43 of the pins. It should be noted that the pins 42, 44, are secured to the carriage 40, such as via a tab 47 at right angles to the carriage 40.

Figure 6A:
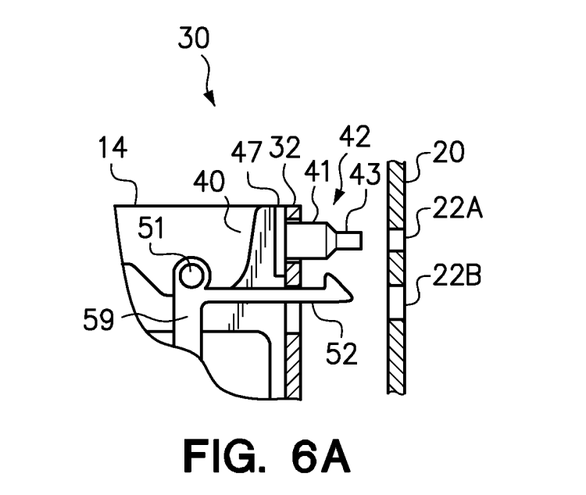
FIGS. 6A through 6D are partial cross-sectional side views one pin and one latch arm during stages of securing the end of the toolless rail to a vertical rack rail.

FIGS. 6A through 6D are partial cross-sectional side views of one retractable pin 42 and one latch arm 52 during stages of securing the end of the toolless rail to a vertical rack rail 20. In FIG. 6A, the rail segment 14 has been positioned in a rack so that the retractable pin 42 is aligned with one hole 22A in the vertical rack rail 20 and the latch arm 52 is aligned with another hole 22B. Since there is no contact between the latch assembly 30 and the vertical rack rail 20, the pin 42 is in the fully extended position and the latch arm 52 is in the latched position.

Figure 6B:
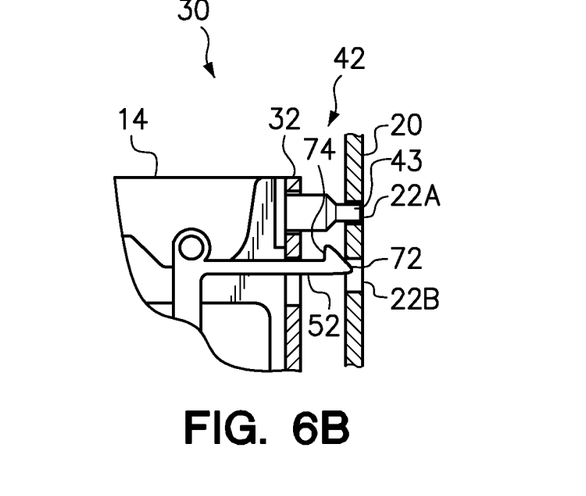

In FIG. 6B, the rail segment 14 has been advanced toward the vertical rack rail 20 until the distal portion 43 of the retractable pin 42 enters the aligned hole 22A and the slanted surface 72 has engaged the edge of the hole 22B that it is aligned with.

Figure 6C:
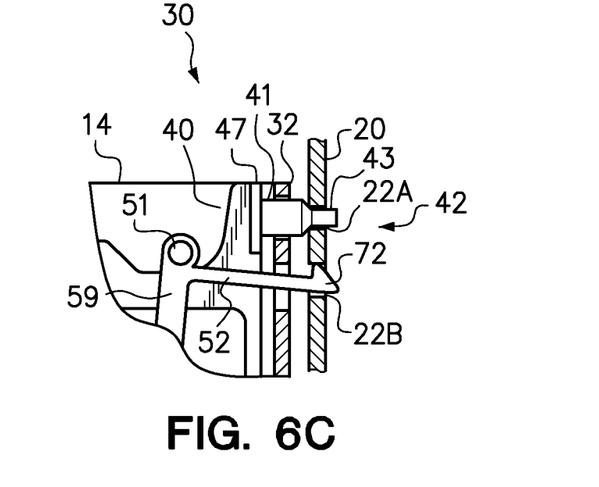

In FIG. 6C, the rail segment 14 has been advanced further toward the vertical rack rail 20 (to the right in FIG. 6C), such that the retractable pin 42 has begun to retract and the latch arm 52 has move toward the unlatched position. Because the vertical rack rail hole 22A is big enough to receive the distal portion 43 of the pin 42, but not the larger diameter proximal portion 41, the pin 42 is unable to advance further. Accordingly, the flange 32 has moved toward the vertical rack rail 20 while the pin 42 and carriage 40 have retracted. The latch arm 52 is not retractable, such that the further advance of the rail segment 14 has caused the slanted surface 72 to push the latch arm 52 toward an unlatched position.

Figure 6D:
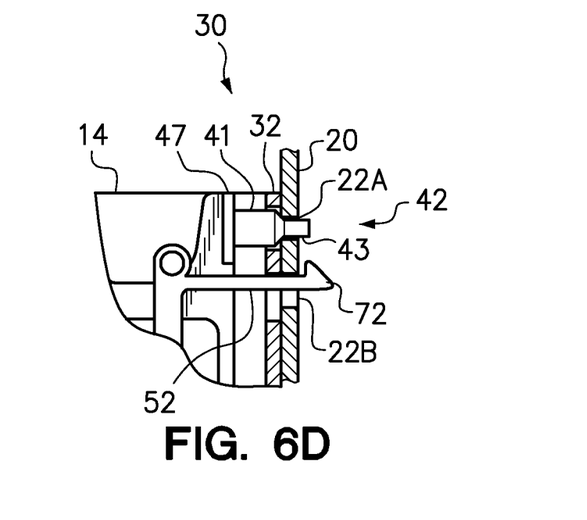

In FIG. 6D, the rail segment 14 has been advanced until the flange 32 engages the vertical rack rail 20. The retractable pin 42 is now in its fully retracted position. However, it should be recognized that if the hole 22A was large enough to receive the proximal portion 41, then the pin 42 would have never retracted. In the position shown, the latch arm 52 has advanced into the other hole 22B a sufficient distance that the slanted surface has disengaged the edge of the hole. Under the force of the spring, this has allowed the latch arm 52 to move to the latched position with the hook 74 preventing the subsequent separation of the flange 32 away from the vertical rack rail 20.

Figure 7A:
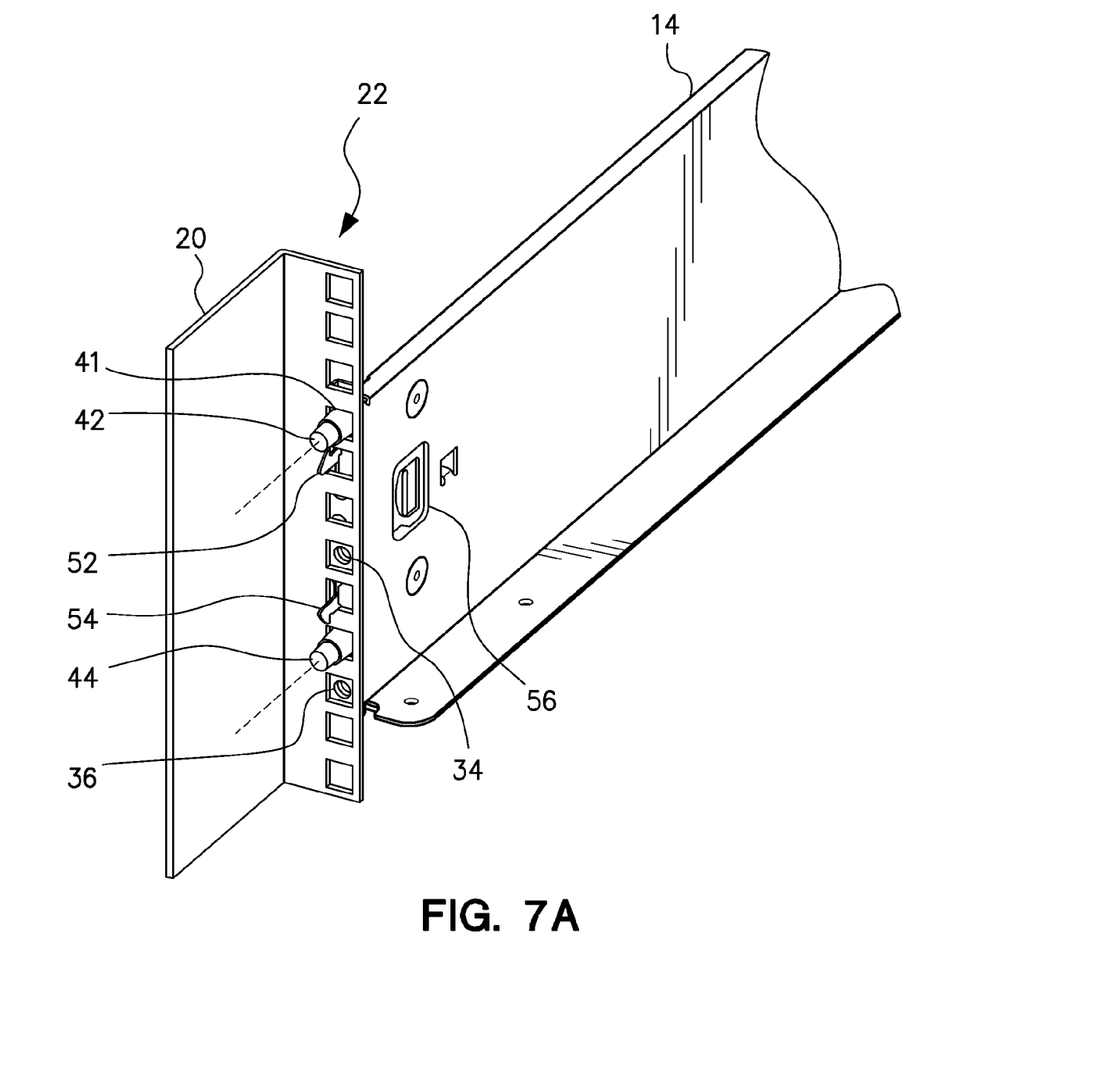
FIGS. 7A and 7B are perspective views of the end of the toolless rail as shown in FIG. 2 after the toolless rail has been moved into an installed, latched position and an unlatched position for being uninstalled, respectively.
Figure 7B:
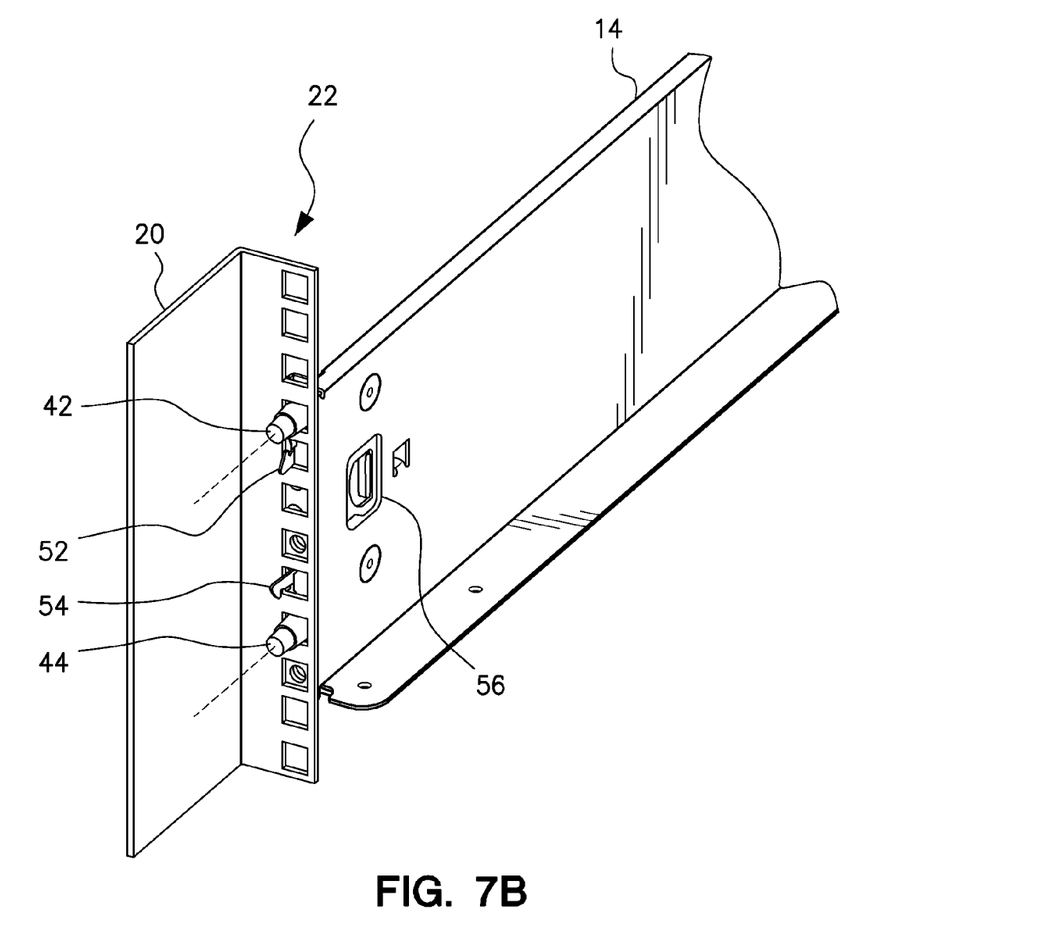

FIGS. 7A and 7B are perspective views of one end of a toolless rail as shown in FIG. 2 after the toolless rail has been moved into an installed, latched position and an unlatched position for being uninstalled, respectively. In FIG. 7A, the proximal portions 41 of the two pins 42, 44 are received in holes 22 of the vertical rack rail 20. The distance between the pins 42, 44 improves the alignment and stability of the rail. This Figure also shows the two latch arms 52, 54 in the latched position, and two threaded holes 34, 36 accessible through two other holes 22. With the latch arms in the latched position, the release handle 56 is in its forward, secured position. In FIG. 7B, the release handle 56 has been manually moved away from the flange 32 to a releasing position such that the latch arms 52, 54 have been actuated to their unlatched position. As shown in FIG. 7B, the rail segment 14 may now be moved away from the flange 32 for removal of the rail from the rack. This is possible because of the telescoping design of the rail.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A rail for toolless installation between first and second vertical rack rails, comprising:
   a telescoping rail body having a first end, a second end, and an inside surface having a shelf; and
   a latch assembly disposed at each end of the rail body, each latch assembly comprising:
      a flange secured to one end of the rail body;
      a first latch arm pivotally secured to the rail body, distally extending from the flange, and biased toward a latched position;
      a release handle accessible from the inside surface of the rail body, wherein manual movement of the release handle will move the first latch arm from a latched position to an unlatched position;
      a retractable pin distally extending from each end and biased toward a distally extended position, wherein the pin is stepped from a distal portion having a first diameter to a proximal portion having a second diameter greater than the first diameter;
   wherein the latch assembly includes a second latch arm;
   wherein the first latch arm has a first lever arm and the second latch arm has a second lever arm, and wherein the first and second lever arms extend toward each other and engage the release handle;
   wherein the first and second latch arms are biased away from one another and each has a hook facing away from the other latch arm.

2. The rail of claim 1, wherein the telescoping rail body is installed with the first end against the first vertical rack rail and the second end against the second vertical rack rail.

3. The rail of claim 1, wherein the distal portion of the retractable pin will seat within vertical rack rail holes having a first dimension, and wherein the proximal portion of the retractable pin will seat within vertical rack rail holes having a second dimension greater than the first dimension and will not seat within vertical rack rail holes having the first dimension.

4. The rail of claim 1, wherein the distal portion of the retractable pin and the proximal portion of the retractable pin are substantially cylindrical.

5. The rail of claim 1, wherein the inside surface of the rail body aligns with an inside edge of the vertical rack rails.

6. The rail of claim 5, wherein the flange is perpendicular to the rail and extends away from the inside surface of the rail.

7. The rail of claim 5, wherein the first and second ends of the rail body are secured to opposing faces of the first and second vertical rack rails with no portion of the rail extending around the inside edge of the vertical rack rails.

8. The rail of claim 1, wherein the rail body is 2 U in height.

9. The rail of claim 1, wherein the first latch arm has a distal surface that is slanted to cause the first latch arm to retract against the bias upon engagement of the slanted surface with an edge of a hole in one of the vertical rack rails.

10. The rail of claim 1, wherein the first latch arm is pivotally secured to an outside surface of the rail body.

11. The rail of claim 1, wherein the latch assembly includes a second retractable pin distally extending from each end and biased toward a distally extended position, wherein the pin is stepped from a distal portion having a first diameter to a proximal portion having a second diameter greater than the first diameter.

12. The rail of claim 11, wherein the first and second retractable pins at the first end are coupled to retract or extend together.

13. The rail of claim 11, wherein the retractable pins extend from the flange at points adjacent a top and a bottom of the flange with the latch arms extending from the flange between the retractable pins.

14. The rail of claim 1, wherein the release handle is slidably secured to the rail body.

15. The rail of claim 14, wherein manual movement of the release handle in a direction away from the adjacent rail flange will move the first latch arm from the latched position to the unlatched position.

16. The rail of claim 1, wherein the rail flange includes a threaded element spaced apart from the retractable pins at a fixed distance for alignment with a flange hole in order to threadably receive a threaded fastener.

17. The rail of claim 1, characterized in that the rail can be installed between first and second vertical rack rails without vertical movement of the rail.

18. The rail of claim 1, characterized in that the rail can be installed with access to only one side of the rack.

19. The rail of claim 1, characterized in that the rail flange engages the vertical rack rail regardless of whether the holes in the vertical rack receive the distal portion of the retractable pin having the first diameter or the proximal portion of the retractable pin having the second diameter greater than the first diameter.

* * * * *